United States Patent
Kim et al.

(10) Patent No.: US 9,520,373 B2
(45) Date of Patent: Dec. 13, 2016

(54) SEMICONDUCTOR PACKAGE

(71) Applicant: Samsung Electronics Co., Ltd., Suwon-si, Gyeonggi-do (KR)

(72) Inventors: Yong-hoon Kim, Suwon-si (KR); Keung-beum Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/978,550

(22) Filed: Dec. 22, 2015

(65) Prior Publication Data

US 2016/0300806 A1 Oct. 13, 2016

(30) Foreign Application Priority Data

Apr. 13, 2015 (KR) .......................... 10-2015-0052081

(51) Int. Cl.
*H01L 29/40* (2006.01)
*H01L 23/00* (2006.01)

(52) U.S. Cl.
CPC ......... *H01L 24/08* (2013.01); *H01L 2224/024* (2013.01); *H01L 2224/02331* (2013.01); *H01L 2224/02373* (2013.01)

(58) Field of Classification Search
CPC ............................ H01L 24/08; H01L 2224/024
USPC ........................................................ 257/773
See application file for complete search history.

(56) References Cited

U.S. PATENT DOCUMENTS

| | | | |
|---|---|---|---|
| 4,296,475 A | 10/1981 | Nederlof et al. | |
| 8,149,585 B2 | 4/2012 | Kawano | |
| 8,274,147 B2 * | 9/2012 | Rofougaran | H05K 1/0237 257/728 |
| 2007/0029662 A1 | 2/2007 | Lee | |
| 2008/0224306 A1 | 9/2008 | Yang | |
| 2010/0301459 A1 | 12/2010 | Akiba et al. | |

FOREIGN PATENT DOCUMENTS

| | | |
|---|---|---|
| JP | 2009290174 A | 12/2009 |
| KR | 20010105641 A | 11/2001 |
| KR | 100850897 B1 | 8/2008 |
| KR | 101101435 B1 | 1/2012 |
| KR | 20140028642 A | 3/2014 |

* cited by examiner

*Primary Examiner* — Anthony Ho
(74) *Attorney, Agent, or Firm* — Harness, Dickey & Pierce, P.L.C.

(57) ABSTRACT

Provided is a semiconductor package including a semiconductor chip having one surface on which chip pads are formed, and a redistribution structure formed on the one surface of the semiconductor chip. The redistribution structure includes a redistribution layer connected to the chip pads and a redistribution insulating layer interposed between the semiconductor chip and the redistribution layer. The redistribution insulating layer includes a first insulating portion having a first dielectric constant and a second insulating portion having a second dielectric constant that is different from the first dielectric constant. The first insulating portion and the second insulating portion are connected to each other in a horizontal direction.

20 Claims, 19 Drawing Sheets

SEMICONDUCTOR PACKAGE

CROSS-REFERENCE TO RELATED APPLICATION

This application claims the benefit of Korean Patent Application No. 10-2015-0052081, filed on Apr. 13, 2015, in the Korean Intellectual Property Office, the disclosure of which is incorporated herein in its entirety by reference.

BACKGROUND

Example embodiments of the inventive concepts relate to a semiconductor package.

In recent years, semiconductor products tend to be continuously downscaled, made thin and lightweight, and highly integrated and densified. As semiconductor packages have become highly integrated, the thicknesses of insulating layers included in the semiconductor packages may be reduced. Thus, semiconductor package technology capable of ensuring signal integrity characteristics may be desired for operations of a semiconductor package and improving power integrity characteristics.

SUMMARY

According to some example embodiments of the inventive concepts, there is provided a semiconductor package including a semiconductor chip having one surface on which chip pads are formed, and a redistribution structure formed on the one surface of the semiconductor chip. The redistribution structure includes a redistribution layer connected to the chip pads and a redistribution insulating layer interposed between the semiconductor chip and the redistribution layer. The redistribution insulating layer includes a first insulating portion having a first dielectric constant and a second insulating portion having a second dielectric constant that is different from the first dielectric constant. The first insulating portion and the second insulating portion are connected to each other in a horizontal direction.

The chip pads may include a power pad, a ground pad, and a signal pad. A first region of the semiconductor chip in which the power pad and the ground pad are disposed may overlap the first insulating portion, and a second region of the second chip in which the signal pad is disposed may overlap the second insulating portion.

The power pad may be connected to a power source disposed outside the semiconductor package, and the ground pad may be connected to a ground disposed outside the semiconductor package, and the signal pad may receive and transmit signals from and to the outside of the semiconductor package.

The first dielectric constant may be higher than the second dielectric constant.

The second dielectric constant may range from 1.5 to 6.9, and the first dielectric constant may range from 7 to 1000.

The first insulating portion and the second insulating portion may have coplanar surfaces on which the redistribution layer is disposed.

The first insulating portion may be disposed in a region that overlaps a central region of the semiconductor chip in a plan view. The second insulating portion may be disposed in a region that surrounds the first insulating portion in a plan view.

The semiconductor package may further include external connection terminals connected to the redistribution layer; and an outermost insulating layer formed to cover at least portions of the redistribution layer and the external connection terminals, the outermost insulating layer having a third dielectric constant. The third dielectric constant may be lower than the first dielectric constant.

According to some example embodiments of the inventive concepts, there is provided a semiconductor package including a semiconductor chip comprising a first region in which a power pad and a ground pad are disposed and a second region in which a signal pad is disposed, and a redistribution structure disposed on the first and second regions of the semiconductor chip. The redistribution structure includes at least one redistribution layer connected to the chip pads, and at least one redistribution insulating layer disposed between the redistribution layer and the semiconductor chip. The redistribution insulating layer includes a first insulating portion having a first dielectric constant and a second insulating portion having a second dielectric constant that is lower than the first dielectric constant. The first insulating portion overlaps the first region of the semiconductor chip in which the power pad and the ground pad are disposed, and the second insulating portion overlaps the second region of the semiconductor chip in which the signal pad is disposed.

The at least one redistribution layer may include a plurality of redistribution layers spaced apart from one another in a vertical direction. The power pad may be connected to a first redistribution layer selected out of the redistribution layers, and the ground pad may connected to a second redistribution layer that is different from the first redistribution layer selected out of the redistribution layers.

The at least one redistribution insulating layer may include first and second redistribution insulating layers. The first redistribution insulating layer may include the first insulating portion having the first dielectric constant and the second insulating portion having the second dielectric constant. The second redistribution insulating layer may include a third insulating portion, which overlaps the first insulating portion and has a third dielectric constant, and a fourth insulating portion, which overlaps the second insulating portion and has a fourth dielectric constant that is lower than the third dielectric constant.

The at least one redistribution insulating layer may include first and second redistribution insulating layers. The first redistribution insulating layer may include the first insulating portion having the first dielectric constant and a second insulating portion having the second dielectric constant. The second redistribution insulating layer may have a third dielectric constant that is lower than the first dielectric constant.

The semiconductor package may further include a mold unit disposed on the redistribution structure to cover the semiconductor chip.

According to some example embodiments of the inventive concepts, a semiconductor package may include a printed circuit board (PCB), and a semiconductor chip mounted on the PCB. The PCB may include a body resin including a top surface and a bottom surface, and an interconnection pattern formed on at least one of the top surface and the bottom surface of the body resin. The body resin may include a first body portion having a first dielectric constant and a second body portion having a second dielectric constant that is different from the first dielectric constant.

The first dielectric constant of the first body portion may be higher than the second dielectric constant of the second body portion.

The first dielectric constant may range from 7 to 1000.

The semiconductor chip may include a power pad, a ground pad, and a signal pad,

The first body portion may be disposed in a region that overlaps the power pad and the ground pad, and the second body portion may be disposed in a region that overlaps the signal pad.

The first body portion may be disposed in a region that overlaps a central region of the semiconductor chip in a plan view, and the second body portion may be disposed in a region that surrounds the first body portion in the plan view.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
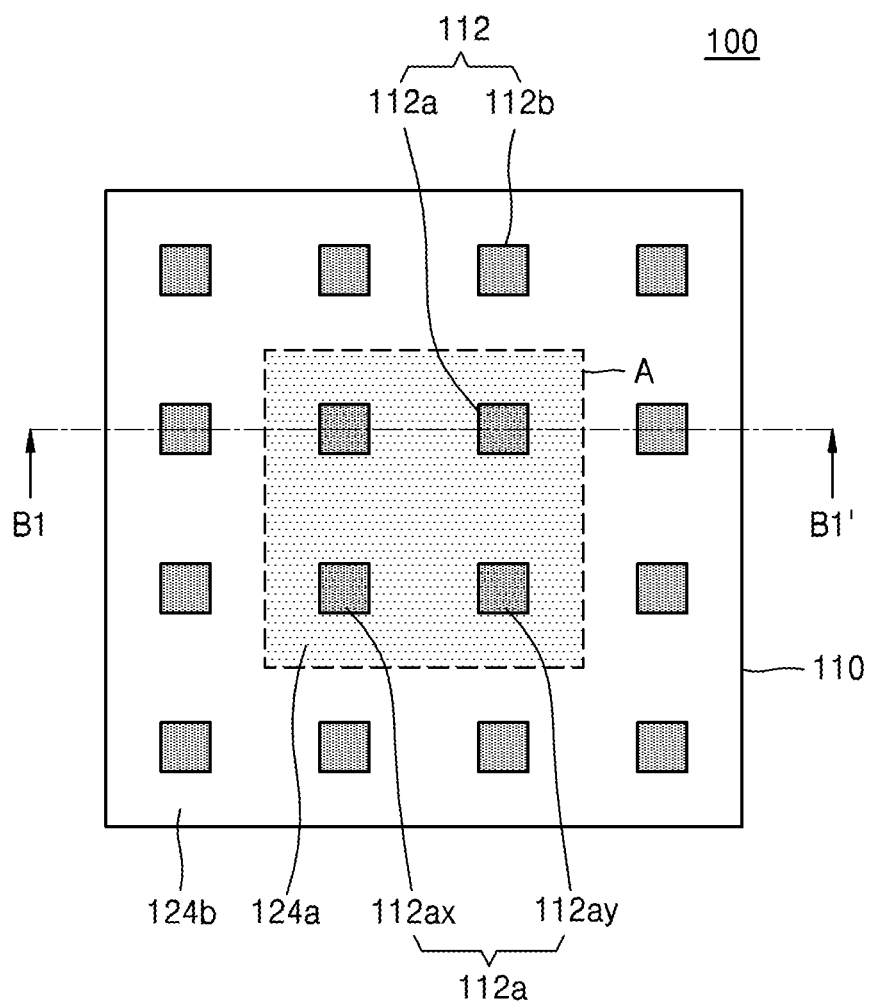
FIG. 1A is a plan view of a semiconductor package according to some example embodiments.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully hereinafter with reference to the accompanying drawings, in which example embodiments of the inventive concepts are shown. This inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art. In the drawings, the thicknesses of layers and regions are exaggerated for clarity. Like reference numerals in the drawings denote like elements, and thus their description will be omitted.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless explicitly so defined herein.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing.

Figure 1B:
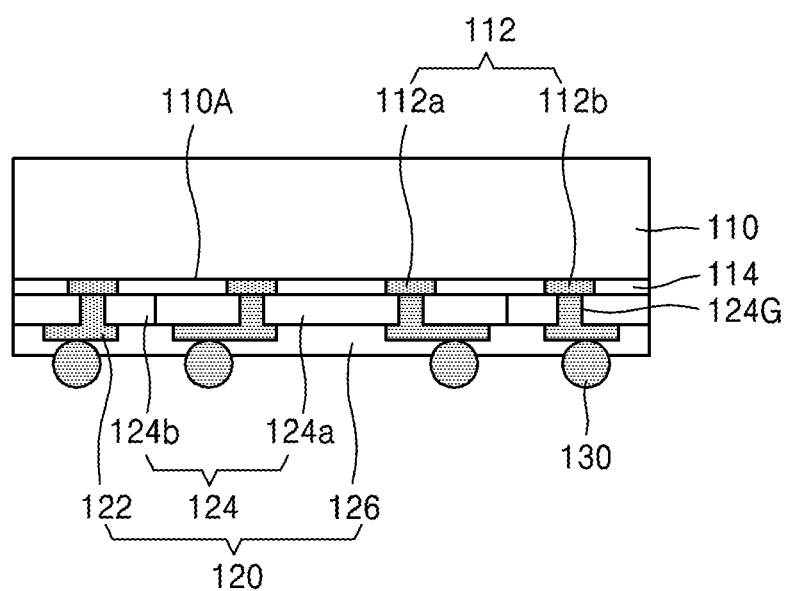
FIG. 1B is a cross-sectional view taken along line B1-B1' of FIG. 1A.

FIG. 1A is a plan view of a semiconductor package 100 according to some example embodiments, and FIG. 1B is a cross-sectional view taken along line B1-B1' of FIG. 1A.

The semiconductor package 100 shown in FIGS. 1A and 1B may be a wafer-level package (WLP) in which a redistribution layer 122 and an external connection terminal 130 are formed on a semiconductor chip 110 without a printed circuit board (PCB).

Referring to FIGS. 1A and 1B, the semiconductor package 100 may include the semiconductor chip 110, a redistribution structure 120 disposed on one surface 110A of the semiconductor chip 110, and external connection terminals 130 connected to the redistribution layer 122 of the redistribution structure 120.

The one surface 110A of the semiconductor chip 110 may be, for example, an active surface of the semiconductor chip 110, and chip pads 112 and a protection layer 114 may be formed on the one surface 110A of the semiconductor chip 110. The protection layer 114 may protect the one surface 110A of the semiconductor chip 110 and may insulate separate chip pads 112 from one another.

Although the chip pads 112 are disposed in the semiconductor package 100, the chip pads 112 are illustrated in FIG. 1A for brevity.

In some embodiments, the chip pads 112 may include a power/ground pad 112a and a signal pad 112b.

The sizes of the power/ground pad 112a and the signal pad 112b according to the present embodiment may be exaggerated for clarity, and the numbers of power/ground pads 112a and signal pads 112b are only examples. That is, the shape, size, and number of the chip pads 112 are not limited to FIGS. 1A and 1B.

The power/ground pad 112a may be connected to a power supply unit (e.g., a power source, a voltage regulator, a voltage regulator module (VRM), a power processing module (PPM), or a power management unit (PMU) disposed outside the semiconductor package 100) or a ground disposed outside the semiconductor package 100.

As shown in FIG. 1A, the power/ground pad 112a may include a first power/ground pad 112ax and a second power/ground pad 112ay. For example, the first power/ground pad 112ax may be connected to the power source outside the semiconductor package 100, and the second power/ground pad 112ay may be connected to the ground outside the semiconductor package 100.

The signal pad 112b may be connected to a circuit structure disposed outside the semiconductor package 100. The signal pad 112b may transmit and receive signals to and from outside the semiconductor package 100.

In some embodiments, as shown in FIG. 1A, the power/ground pad 112a may be disposed in a central region (e.g. the inside of a region A) of the semiconductor chip 110, and the signal pad 112b may be disposed in an edge region (e.g., outside the region A) of the semiconductor chip 110. Meanwhile, a structure of the redistribution structure 120 may be changed depending on the arrangement of the power/ground pad 112a and the signal pad 112b, and detailed descriptions thereof will be presented later.

In some embodiments, the semiconductor chip 110 may be a memory device, a logic device (e.g., a microprocessor (MP), an analog device, or a digital signal processor (DSP)), or a semiconductor chip (e.g. a system-on-chip (SoC)) capable of various functions. The memory device may include, for example, dynamic random access memory (DRAM), static RAM (SRAM), flash memory, electrically erasable and programmable read-only memory (EEPROM), phase-change RAM (PRAM), magnetic RAM (MRAM), or resistive RAM (RRAM).

Also, the semiconductor chip 110 may be a multi-chip having a stacked structure of at least two semiconductor chips. For example, at least two semiconductor chips may be memory devices of the same type. Alternatively, one of the at least two semiconductor chips may be a memory device, and another one thereof may be a microcontroller.

The redistribution structure 120 may include the redistribution layer 122 connected to the chip pads 112, a redistribution insulating layer 124 interposed between the semiconductor chip 110 and the redistribution layer 122, and an outermost insulating layer 126 formed to cover at least portions of the redistribution layer 122 and the external connection terminals 130.

The redistribution layer 122 may connect the chip pads 112 of the semiconductor chip 110 with the external connection terminals 130, respectively, Accordingly, power supplied from outside the semiconductor package 100 may be transmitted to the semiconductor chip 110, or the semiconductor chip 110 may transmit and receive signals to and from outside the semiconductor package 100.

For example, the formation of the redistribution layer 122 may include forming a metal layer to cover the redistribution insulating layer 124 and the chip pads 112 exposed by openings 124G in the redistribution insulating layer 124, and patterning the metal layer, which will be described in detail later with reference to FIG. 8G.

The redistribution insulating layer 124 may be interposed between the semiconductor chip 110 and the redistribution layer 122. That is, the redistribution insulating layer 124 may be formed in a region between the chip pads 112 and the redistribution layer 122.

The redistribution insulating layer 124 may include a first insulating portion 124a and a second insulating portion 124b. The first insulating portion 124a and the second insulating portion 124b may be connected to each other in a horizontal direction. The first insulating portion 124a and the second insulating portion 124b may have substantially coplanar surfaces on which the redistribution layer 122 may be disposed, but are not limited thereto In some embodiments, the first insulating portion 124a may be formed to overlap a region (inside the region A of FIG. 1A) in which the power/ground pad 112a of the semiconductor chip 110 is formed, and the second insulating portion 124b may be formed to overlap a region (outside the region A of FIG. 1A) in which the signal pad 112b of the semiconductor chip 110 is formed. That is, the first insulating portion 124a may be disposed on a central region (inside the region A) of the semiconductor chip 110, and the second insulating portion 124b may be disposed on an edge region (outside the region A) of the semiconductor chip 110.

In some embodiments, the power/ground pad 112a according to the present embodiment may be disposed in the central region (inside the region A) of the semiconductor chip 110, and the signal pad 112b may be disposed in the edge region (outside the region A) of the semiconductor chip 110. However, the inventive concepts are not limited thereto, and the power/ground pad 112a and the signal pad 112b may have various arrangement structures. In this case, an arrangement structure of the first insulating portion 124a and the second insulating portion 124b may also vary depending on the arrangement structure of the power/ground pad 112a and the signal pad 112b.

The first insulating portion 124a and the second insulating portion 124b may include materials having different dielectric constants. In some embodiments, the first insulating portion 124a may include a material having a first dielectric constant, and the second insulating portion 124b may include a material having a second dielectric constant that is different from the first dielectric constant.

The first dielectric constant may be higher than the second dielectric constant. In some embodiments, the first insulating portion 124a may include a high-k dielectric material having a dielectric constant of 7 or more. In some embodiments, the first dielectric constant may range from 7 to 1000.

The first insulating portion 124a may include a high-k dielectric material having a higher dielectric constant than silicon oxide ($SiO_x$). For example, the first insulating portion 124a may include hafnium silicon oxynitride (HfSiON), hafnium oxide ($HfO_2$), zirconium oxide ($ZrO_2$), tantalum oxide ($Ta_2O_5$), titanium oxide ($TiO_2$), strontium titanium oxide ($SrTiO_5$), and/or barium strontium titanium oxide (($Ba,Sr)TiO_5$).

The second insulating portion 124b may include a low-k dielectric material having a dielectric constant of less than 7. In some embodiments, the second dielectric constant may range from 1.5 to 6.9.

For example, the second insulating portion 124b may include polyimide, a silicon-based material (e.g., $SiO_2$, SiOC, SiC, SiCN, SiON, or SiCOH), polybenzoxazole, and/or an epoxy-based material. Thus, when the redistribution insulating layer 124 includes the first insulating portion 124a and the second insulating portion 124b having different dielectric constants, power integrity characteristics of the semiconductor package 100 may be improved, and desired signal integrity characteristics may be maintained.

Specifically, when the first insulating portion 124a includes a high-k dielectric material, a capacitance between the power/ground pad 112a of the semiconductor chip 110 and the redistribution layer 122 and/or a capacitance between the power/ground pad 112a and the external connection terminal 130 may increase. When the capacitance between the power/ground pad 112a and the redistribution layer 122 and/or the capacitance between the power/ground pad 112a and/or the external connection terminal 130 increase, even if power is unstably supplied to the semiconductor package 100, unstable power supply may be improved due to the capacitance. Thus, power integrity characteristics of the semiconductor package 100 may be enhanced.

Meanwhile, the second insulating portion 124b may have a lower dielectric constant than the first insulating portion 124a so that the semiconductor package 100 may maintain desired (or, alternatively required) signal integrity characteristics. When the second insulating portion 124b includes a similar high-k dielectric material to that of the first insulating portion 124a, signals to be transmitted to the semiconductor package 100 may be distorted or cut off due to the capacitance between the signal pad 112b and the redistribution structure 120. That is, since the second insulating portion 124b includes a low-k dielectric material, the capacitance between the signal pad 112b and the redistribution structure 120 and/or the capacitance between the signal pad 112b and the external connection terminal 130 may be comparatively reduced. As a result, degradation of signal integrity characteristics of the semiconductor package 100 may be prevented or reduced.

The outermost insulating layer 126 may be formed to cover at least portions of the redistribution layer 122 and the external connection terminals 130, and protect the redistribution layer 122 from the outside.

In some embodiments, the outermost insulating layer 126 may include a low-k dielectric material having a dielectric constant of less than 7. In some embodiments, the outermost insulating layer 126 may include the same material as the second insulating portion 124b. That is, the outermost insulating layer 126 may have the same dielectric constant as the second dielectric constant of the second insulating portion 124b.

In some other embodiments, the outermost insulating layer 126 may include a material having a third dielectric constant, which is different from the first dielectric constant of the first insulating portion 124a and the second dielectric constant of the second insulating portion 124b. The external connection terminals 130 may serve to connect the semiconductor package 100 with a PCB or motherboard disposed outside the semiconductor package 100.

In some embodiments, the external connection terminals 130 may be solder balls. Although not shown, ball lands (not shown) for forming the external connection terminals 130 may be formed between the redistribution structure 120 and the external connection terminals 130.

Figure 2A:
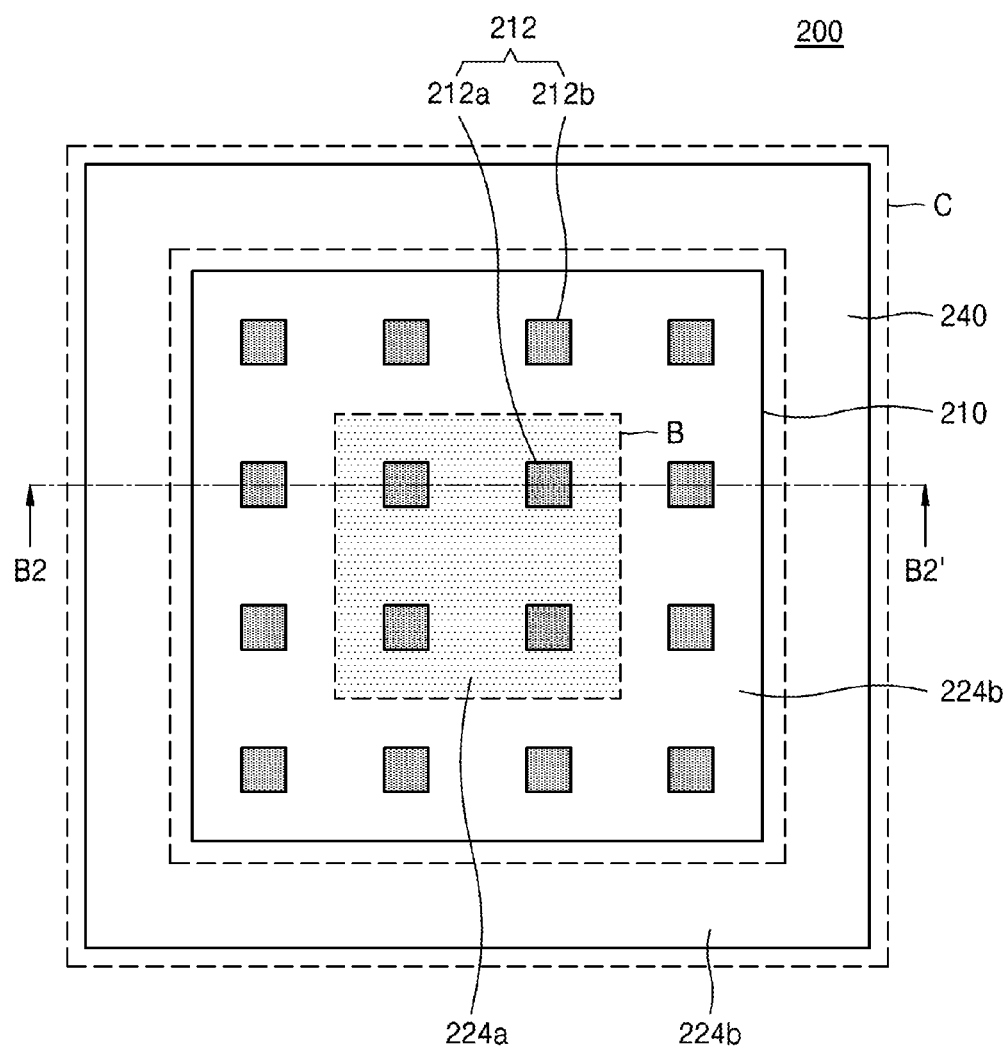
FIG. 2A is a plan view of a semiconductor package according to some example embodiments.
Figure 2B:
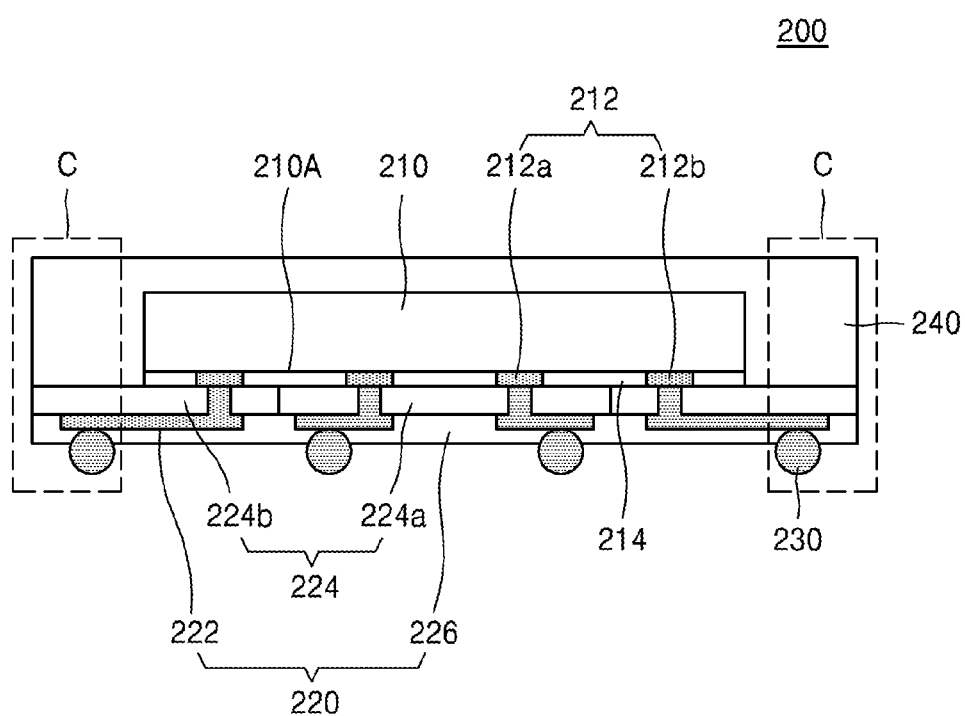
FIG. 2B is a cross-sectional view taken along line B2-B2' of FIG. 2A.

FIG. 2A is a plan view of a semiconductor package 200 according to some example embodiments, and FIG. 2B is a cross-sectional view taken along line B2-B2' of FIG. 2A.

Similar to the semiconductor package 100 described with reference to FIGS. 1A and 1B, the semiconductor package 200 shown in FIGS. 2A and 2B may be a WLP. However, the semiconductor package 200 may have a fan-out structure, unlike the semiconductor package 100 shown in FIGS. 1A and 1B, and differences between the semiconductor package 100 and the semiconductor package 200 having the fan-out structure will now be mainly described.

Referring to FIGS. 2A and 2B, the semiconductor package 200 may include a semiconductor chip 210, a redistribution structure 220 disposed on one surface 210A of the semiconductor chip 210, external connection terminals 230 connected to the redistribution layer 222 of the redistribution structure 220, and a mold unit 240.

Chip pads 212 including a power/ground pad 212a and a signal pad 212b and a protection layer 214 may be formed on the one surface 210A of the semiconductor chip 210. Although the chip pads 212 are disposed inside the semiconductor package 200, the chip pads 212 are illustrated in FIG. 2A for brevity.

The semiconductor chip 210, the chip pads 212, the protection layer 214, and the external connection terminals 230 may substantially have the same structures as the semiconductor chip 110, the chip pads 112, the protection layer 114, and the external connection terminals 130 described with reference to FIGS. 1A and 1B, respectively, and thus descriptions thereof are omitted.

The redistribution structure 220 may include the redistribution layer 222 connected to the chip pads 212, a redistribution insulating layer 224 interposed between the semiconductor chip 210 and the redistribution layer 222, and an outermost insulating layer 226 formed to cover at least portions of the redistribution layer 222 and the external connection terminals 230.

The redistribution layer 222, the redistribution insulating layer 224, and the outermost insulating layer 226 of the redistribution structure 220 may substantially have the same structures and include the same materials as the redistribution layer 122, the redistribution insulating layer 124, and the outermost insulating layer 126 described with reference to FIGS. 1A and 1B, respectively. However, the redistribution structure 220 according to the present embodiment may have the fan-out structure, which may extend to the outside (a region C) of the semiconductor chip 210.

The redistribution insulating layer 224 may include a first insulating portion 224a and a second insulating portion 224b. The first insulating portion 224a and the second insulating portion 224b may be connected to each other in a horizontal direction. The first insulating portion 2124a and the second insulating portion 224b may have substantially coplanar surfaces on which the redistribution layer 222 may be disposed, but are not limited thereto In some embodiments, the first insulating portion 224a may be formed (inside a region B of FIG. 2A) to overlap a region in which the power/ground pad 212a of the semiconductor chip 210 is formed, and the second insulating portion 224b may be formed to overlap a region in which the signal pad 212b of the semiconductor chip 210 is formed and an external region (the region C) of the semiconductor chip 210. The first insulating portion 224a may be disposed on a central region (the inside of the region B of FIG. 2A) of the semiconductor chip 210, and the second insulating portion 224b may be disposed on the remaining region (outside the region B of FIG. 2A) that surrounds the central region. The first insulating portion 224a and the second insulating portion 224b may include materials having different dielectric constants.

In some embodiments, a first dielectric constant of the first insulating portion 224a may be higher than a second dielectric constant of the second insulating portion 224b. Since materials and effects of the first insulating portion 224a and the second insulating portion 224b are the same as the first insulating portion 124a and the second insulating portion 124b described above with reference to FIGS. 1A and 1B, descriptions thereof are omitted here.

The mold unit 240 may be formed on the redistribution structure 220 to cover the semiconductor chip 210, and protect the semiconductor chip 210 from the outside. The mold unit 240 may be formed to cover another surface opposite to the one surface 210A and sidewalls of the semiconductor chip 210.

In some embodiments, the mold unit 240 may an epoxy-group molding resin or a polyimide-group molding resin. The epoxy-group molding resin may be, for example, a polycyclic aromatic epoxy resin, a bisphenol-group epoxy resin, a naphthalene-group epoxy resin, an o-cresol novolac epoxy resin, a dicyeclopentadiene epoxy resin, a biphenyl-group epoxy resin, or a phenol novolac epoxy resin. In some other embodiments, the molding resin may further include carbon black serving as a coloring agent. Alternatively, the molding resin may further include a hardening agent, a hardening accelerator, a filler, and/or a flame retardant material in addition to carbon black.

Figure 3:
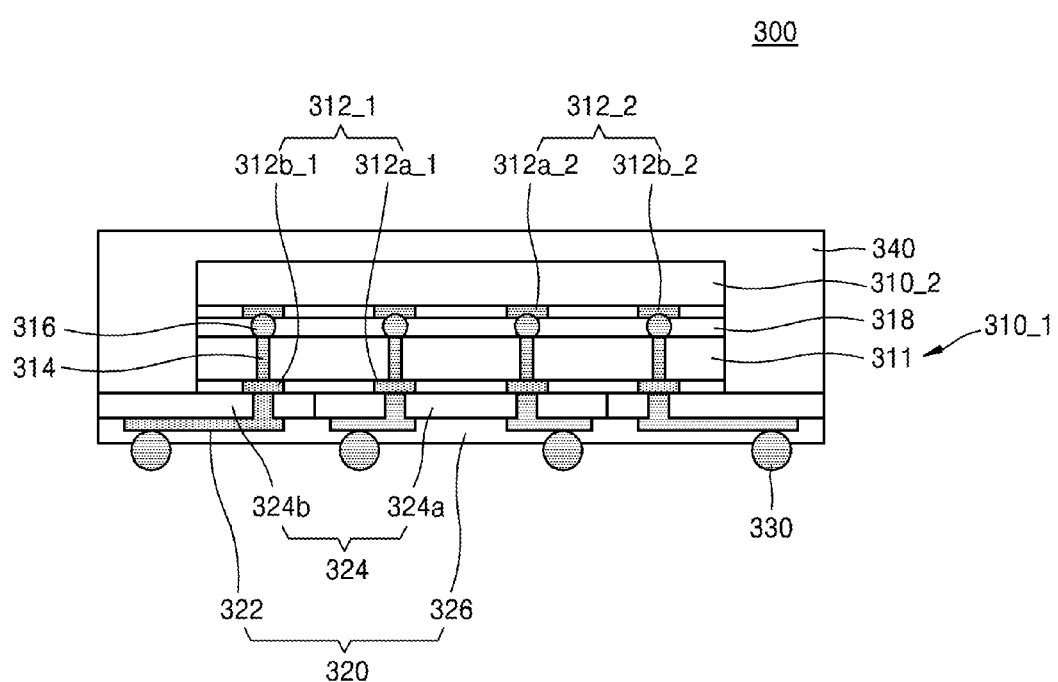
FIG. 3 is a side cross-sectional view of a semiconductor package according to some example embodiments, which corresponds to line B2-B2' of FIG. 2A.

FIG. 3 is a side cross-sectional view of a semiconductor package 300 according to some example embodiments, which is taken along a line B2-B2' of FIG. 2A.

Similar to the semiconductor package 200 described with reference to FIGS. 2A and 2B, the semiconductor package 300 shown in FIG. 3 may be a WLP. However, unlike the semiconductor package 200, the semiconductor package 300 may further include an internal substrate 310_1 interposed between a semiconductor chip 310_2 and a redistribution structure 320.

Referring to FIG. 3, the semiconductor package 300 may include an internal substrate 310_1, a semiconductor chip 310_2, connection members 316, a gap-fill unit 318, the redistribution structure 320, external connection terminals 330, and a mold unit 340.

The internal substrate 310_1 may include a body unit 311, first chip pads 312_1, and through-silicon vias (TSVs) 314.

The internal substrate 310_1 may be formed of an active wafer or an interposer substrate. Here, the active wafer may refer to a wafer (e.g., a silicon wafer) on which a semiconductor chip may be formed.

When the internal substrate 310_1 is formed of an active wafer, the body unit 311 may include a semiconductor substrate, an IC layer, an interlayer insulating layer, and an inter-metal dielectric (IMD) layer. A multi-level interconnection layer may be formed in the IMD layer. Here, the semiconductor substrate may include a Group IV element wafer, such as a silicon wafer, or a Group III-V compound wafer. Also, the semiconductor substrate may include a single-crystalline wafer, such as a single-crystalline silicon wafer. However, the semiconductor substrate is not limited to a single-crystalline wafer and may be one of various wafers, such as an epitaxial wafer, a polished wafer, an annealed wafer, or a silicon-on-insulator (SOI) wafer. Here, an epitaxial wafer refers to a wafer on which a crystalline material is grown on a single-crystalline silicon substrate.

When the internal substrate 310_1 is formed based on an active wafer, the internal substrate 310_1 may function as a memory device or a logic device. The memory device may include, for example, DRAM, SRAM, flash memory, EEPROM, PRAM, MRAM, or RRAM.

Even if the internal substrate 310_1 is formed of an active wafer, the body unit 311 may include only a semiconductor substrate but may not include an IC layer, an interlayer insulating layer, or an IMD layer.

When the internal substrate 310_1 is formed of the interposer substrate, the body unit 311 may simply serve as a support substrate and include silicon, glass, ceramic, or plastic.

The first chip pads 312_1 may include a conductive material on a bottom surface of the body unit 311 and electrically connected to the TSVs 314. Although FIG. 3 illustrates a case in which the first chip pads 312_1 are directly connected to the TSVs 314, the first chip pads 312_1 may be connected to the TSVs 314 through the interconnection layer formed in the body unit 311. The first chip pads 312_1 may include, for example, aluminum (Al) or copper (Cu), by using a pulse plating process or a direct-current (DC) electroplating process.

Similar to the chip pads 112 described with reference to FIGS. 1A and 1B, the first chip pads 312_1 may include a power/ground pad 312a_1 and a signal pad 312b_1, and detailed descriptions thereof are omitted.

The TSVs 314 may be formed through the body unit 311 and electrically connected to the first chip pads 312_1 and the connection members 316.

The TSVs 314 may include at least one metal. For example, the TSVs 314 may include a barrier metal layer and an interconnection metal layer. The barrier metal layer may include one of titanium (Ti), tantalum (Ta), titanium nitride (TiN), and tantalum nitride (TaN), or a stacked structure of at least two thereof. The interconnection metal layer may include at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). For example, the interconnection metal layer may include one of tungsten (W), aluminium (Al), and copper (Cu), or a stacked structure of at least two thereof. However, a material of the TSVs 314 is not limited to the above-described materials.

In some embodiments, the TSV 314 may have any one of a via-first structure, a via-middle structure, and a via-last structure. The via-first structure refers to a structure in which a TSV is formed before integrated circuits are formed. The via-middle structure refers to a structure in which a TSV is formed after integrated circuits are formed and a multi-level interconnection layer is formed. The via-last structure refers to a structure in which a TSV is formed after a multi-level interconnection layer is formed.

Meanwhile, a spacer insulating layer may be interposed between the TSVs 314 and the body unit 311. The spacer insulating layer may prevent circuit devices disposed in the body unit 311 from directly contacting the TSVs 314.

The connection members 316 may electrically connect the TSVs 314 of the internal substrate 310_1 with second chip pads 312_2 of the semiconductor chip 310_2. The connection members 316 may include a conductive material, for example, copper (Cu), aluminum (Al), silver (Ag), tin (Sn), gold (Au), or solder. However, a material of the connection members 316 is not limited to the above-described materials.

Similar to the semiconductor chip 110 described with reference to FIGS. 1A and 1B, the semiconductor chip 310_2 may include the second chip pads 312_2 including a power/ground pad 312a_2 and a signal pad 312b_2.

The semiconductor chip 310_2 may be a memory device or a logic device. As described above, the memory device may include DRAM, SRAM, flash memory, EEPROM, PRAM, MRAM, or RRAM.

Both the internal substrate 310_1 and the semiconductor chip 310_2 may be memory devices or logic devices. Alternatively, any one of the internal substrate 310_1 and the semiconductor chip 310_2 may be a memory device, and the other thereof may be a logic device. For example, the internal substrate 310_1 may be a logic device, and the semiconductor chip 310_2 may be a memory device.

The gap-fill unit 318 may fill a space between the internal substrate 310_1 and the semiconductor chip 310_2 and reinforce binding strength between the internal substrate 310_1 and the semiconductor chip 310_2.

The gap-fill unit 318 may include, for example, non-conductive paste (NCP) or a non-conductive film (NCF).

The redistribution structure 320 may include a redistribution layer 222 connected to the first and second chip pads 312_1 and 312_2, a redistribution insulating layer 324 interposed between the internal substrate 310_1 and the redistribution layer 322, and an outermost insulating layer 326 formed to cover at least portions of the redistribution layer 322 and the external connection terminals 330.

The redistribution layer 322, the redistribution insulating layer 324, and the outermost insulating layer 326 of the redistribution structure 320 may substantially have the same structures and include the same materials as the redistribution layer 222, the redistribution insulating layer 224, and the outermost insulating layer 226 described above with reference to FIGS. 2A and 2B, respectively.

The redistribution insulating layer 324 may include a first insulating portion 324a and a second insulating portion 324b. The first insulating portion 324a and the second insulating portion 324b may be connected to each other in a horizontal direction. The first insulating portion 324a and the second insulating portion 324b may have substantially coplanar surfaces on which the redistribution layer 322 may be disposed, but are not limited thereto.

In some embodiments, the first insulating portion 324a may be disposed on the internal substrate 310_1 and the central region (refer to the region B of FIG. 2A) of the semiconductor chip 310_2, and the second insulating portion 324b may be disposed in the remaining region that surrounds the central region.

In some embodiments, the first insulating portion 324a may be formed to overlap a region in which the power/ground pad 312a_1 of the internal substrate 310_1 and/or the power/ground 312a_2 of the semiconductor chip 310_2 are formed. The second insulating portion 324b may be formed to overlap the remaining region surrounding the first insulating portion 324a, for example, a region in which the signal pad 312b 1 of the internal substrate 310_1 and/or the signal pad 312b_2 of the semiconductor chip 310_2 are disposed. The first insulating portion 324a and the second insulating portion 324b may include materials having different dielectric constants. A first dielectric constant of the first insulating portion 324a may be higher than a second dielectric constant of the second insulating portion 324b. Materials and effects of the first insulating portion 324a and the second insulating portion 324b may be the same as the first insulating portion 124a and the second insulating portion 124b described above with reference to FIGS. 1A and 1B, and thus descriptions thereof are omitted here.

The external connection terminals 330 and the mold unit 340 may respectively have substantially the same structures and materials as the external connection terminals 230 and the mold unit 240 described above with reference to FIGS. 2A and 2B.

Figure 4:
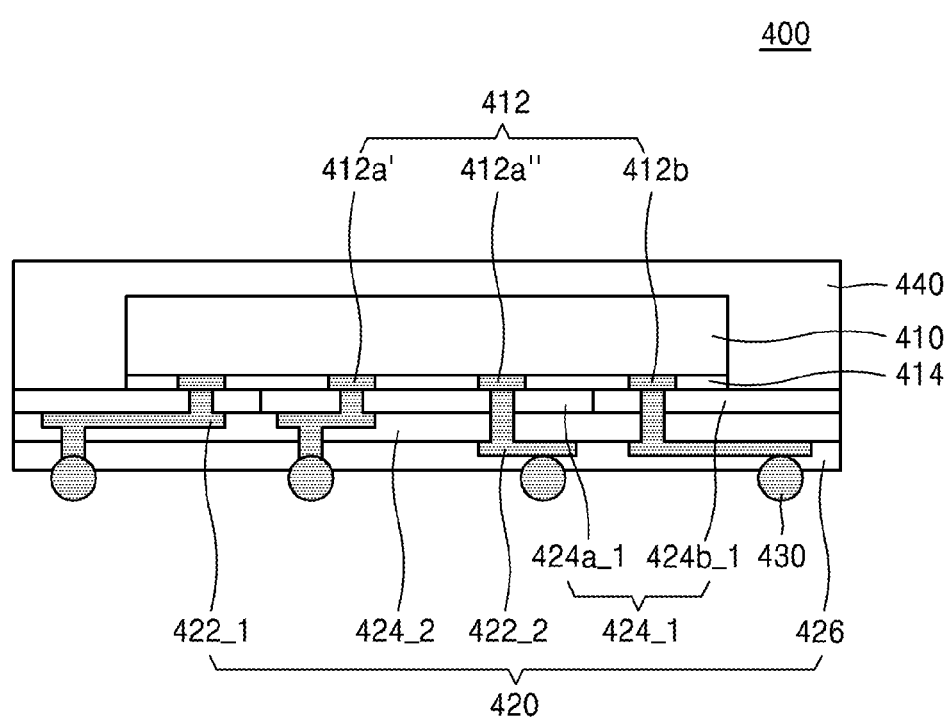
FIG. 4 is a cross-sectional view of a semiconductor package according to some example embodiments.

FIG. 4 is a cross-sectional view of a semiconductor package 400 according to some example embodiments.

Similar to the semiconductor package 200 described with reference to FIGS. 2A and 2B, the semiconductor package 400 shown in FIG. 4 may be a WLP having a fan out structure. However, the semiconductor package 400 may include a redistribution structure 420 including multi-level redistribution layers, for example, first and second redistribution layers 422_1 and 422_2.

Referring to FIG. 4, the semiconductor package 400 may include a semiconductor chip 410, a redistribution structure 420, external connection terminals 430, and a mold unit 440.

Chip pads 412 including power/ground pads 412a' and 412a" and a signal pad 412b and a protection layer 414 may be formed on one surface of the semiconductor chip 410.

The semiconductor chip 410, the chip pads 412, the protection layer 414, the external connection terminals 430, and the mold unit 440 may substantially have the same structures as the semiconductor chip 210, the chip pads 212, the external connection terminal 230, and the mold unit 240 described with reference to FIGS. 2A and 2B, respectively, and thus descriptions thereof are omitted.

The redistribution structure 420 may include the first and second redistribution layers 422_1 and 422_2 connected to the chip pads 412, a first redistribution insulating layer 424_1 interposed between the semiconductor chip 410 and the first redistribution layer 422_1, a second redistribution insulating layer 424_2 interposed between the first redistribution layer 422_1 and the second redistribution layer 422_2, and an outermost insulating layer 426 formed to cover at least portions of the second redistribution layers 422_2 and the external connection terminals 430.

The first and second redistribution layers 422_1 and 422_2 may connect the chip pads 412 of the semiconductor chip 410 with the external connection terminals 430, respectively, Thus, t power supplied from outside the semiconductor package 400 may be transmitted to the semiconductor chip 410, or the semiconductor chip 410 may transmit and receive signals to and from outside the semiconductor package 400.

In some embodiments, the first redistribution layer 422_1 may serve as a power plane configured to transmit power supplied from outside the semiconductor package 400 to the semiconductor chip 410. In this case, the power/ground pad 412a' connected to the first redistribution layer 422_1 may be a power pad.

When the first redistribution layer 422_1 is a power plane, the second redistribution layer 422_2 may serve as a ground plane connected to a ground disposed outside the semiconductor package 400. In this case, the power/ground pad 412a" connected to the second redistribution layer 422_2 may be a ground pad.

The present embodiment describes an example in which the first redistribution layer 422_1 is a power plane and the second redistribution layer 422_2 is a ground plane. However, in another case, the first redistribution layer 422_1 may be a ground plane, and the second redistribution layer 422_2 may be a power plane.

Unlike the power/ground pads 412a' and 412a", the signal pad 412b may be connected to any one of the first and second redistribution layers 422_1 and 422_2.

The first redistribution insulating layer 424_1 may be interposed between the semiconductor chip 410 and the first redistribution layer 422_1. That is, the first redistribution insulating layer 424_1 may be formed in a region between the chip pads 412 and the first redistribution layer 422_1.

The second redistribution insulating layer 424_2 may be interposed between the first redistribution layer 422_1 and the second redistribution layer 422_2.

In some embodiments, any one of the first redistribution insulating layer 424_1 and the second redistribution insulating layer 424_2 may include insulating portions having different dielectric constants.

In a specific example, the first redistribution insulating layer 424_1 may include a first insulating portion 424a_1 having a first dielectric constant and a second insulating portion 424b_1 having a second dielectric constant.

In some embodiments, the first insulating portion 424a_1 may include a high-k dielectric material, and the second insulating portion 424b_1 may include a low-k dielectric material having a lower dielectric constant than the first insulating portion 424a_1. For example, the first insulating portion 424a_1 may include a high-k dielectric material having a dielectric constant of 7 or more (e.g., 7 to 1000).

For example, the first insulating portion 424a_1 may include hafnium silicon oxynitride, hafnium, zirconium oxide, tantalum oxide, strontium titanium oxide, and/or barium strontium titanium oxide. The second insulating portion 424b_1 may include a low-k dielectric material having a dielectric constant of less than 7 (e.g., 1.5 to 6.9), for example, polyimide, a silicon-based material (e.g., $SiO_2$, SiOC, SiC, SiCN, SiON, or SiCOH), polybenzoxazole, and/or an epoxy-based material. In some embodiments, the second redistribution insulating layer 424_2 may include a first portion, which may have a high-k dielectric material equal to or similar to the first insulating portion 424a_1 of the first redistribution insulating layer 424_1 and overlap the first insulating portion 424a_1, and a second portion, which may have a low-k dielectric material equal to or similar to the second insulating portion 424b_1 of the second redistribution insulating layer 424_1 and overlap the second insulating portion 424b_1.

In other embodiments, the second redistribution insulating layer 424_2 may wholly include a low-k dielectric material having a dielectric constant of less than 10.

As described above with reference to FIGS. 1A and 1B, when the first redistribution insulating layer 424_1 or the second redistribution insulating layer 424_2 includes the first insulating portion 424a_1 and the second insulating portion 424b_1 having different dielectric constants, power integrity characteristics of the semiconductor package 400 may be improved, and desired signal integrity characteristics may also be maintained.

Similar to the outermost insulating layer 126 described above with reference to FIGS. 1A and 1B, the outermost insulating layer 426 may be formed to cover at least portions of the second redistribution layers 422_2 and the external connection terminals 430.

The outermost insulating layer 426 may include, for example, a low-k dielectric material having a dielectric constant of less than 7 (e.g., 1.5 to 6.9). In some embodiments, the second insulating portion 424b_1, the second redistribution insulating layer 424_2, and the outermost insulating layer 426 may all include the same material, but the inventive concepts are not limited thereto.

Figure 5:
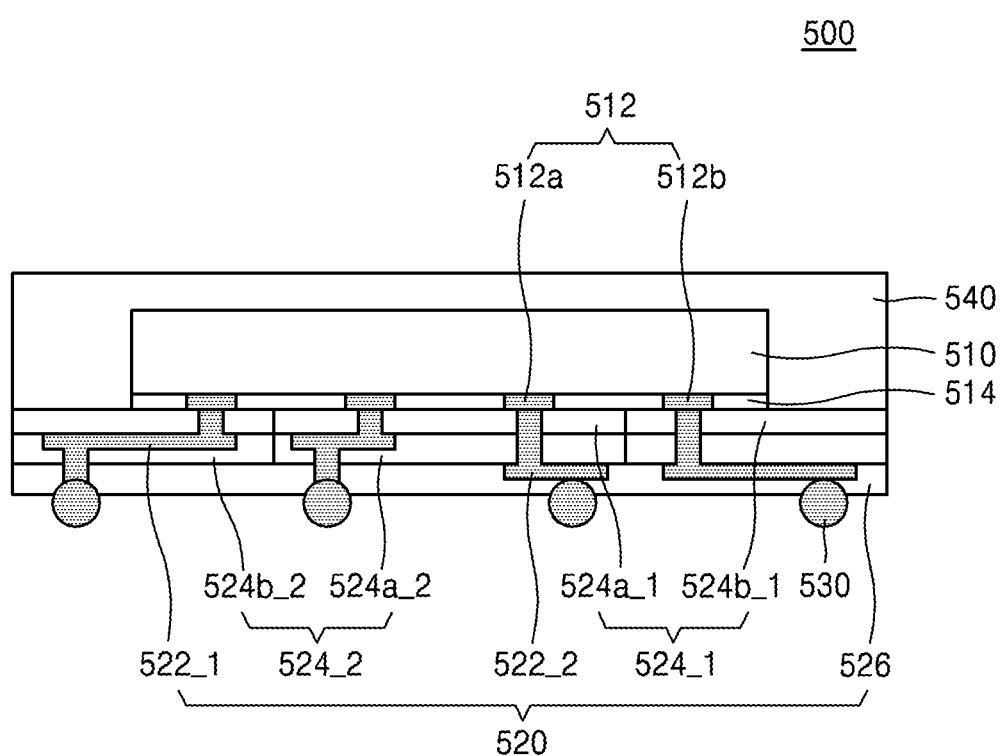
FIG. 5 is a cross-sectional view of a semiconductor package according to some example embodiments.

FIG. 5 is a cross-sectional view of a semiconductor package 500 according to some example embodiments.

The semiconductor package 500 shown in FIG. 5 may be a WLP having a similar structure to the semiconductor package 400 described with reference to FIG. 4 except that each of multi-level redistribution insulating layers 524_1 and 524_2 of the semiconductor package 500 includes a plurality of insulating portions having different dielectric constants.

Referring to FIG. 5, the semiconductor package 500 may include a semiconductor chip 510, a redistribution structure 520, external connection terminals 530, and a mold unit 540.

Chip pads 512 including a power/ground pad 512a and a signal pad 512b and a protection layer 514 may be formed on one surface of the semiconductor chip 510.

The semiconductor chip 510, the chip pads 512, the protection layer 514, the external connection terminals 530, and the mold unit 540 may substantially have the same structures as the semiconductor chip 410, the chip pads 412, the protection layer 414, the external connection terminals 430, and the mold unit 440 described with reference to FIG. 4, and thus descriptions thereof are omitted.

The redistribution structure 520 may include first and second redistribution layers 522_1 and 522_2 connected to the chip pads 512, a first redistribution insulating layer 524_1 interposed between the semiconductor chip 510 and the first redistribution layer 522_1, a second redistribution insulating layer 524_2 interposed between the first redistribution layer 522_1 and the second redistribution layer 522_2, and an outermost insulating layer 526 formed to cover at least portions of the second redistribution layers 522_2 and the external connection terminals 530.

Each of the first redistribution insulating layer 524_1 and the second redistribution insulating layer 524_2 may include insulating portions having different dielectric constants.

Specifically, the first redistribution insulating layer 524_1 may include a first insulating portion 524a_1 having a first dielectric constant and a second insulating portion 524b_1 having a second dielectric constant, and the second redistribution insulating layer 524_2 may include a third insulating portion 524a_2 having a third dielectric constant and a fourth insulating portion 524b_2 having a fourth dielectric constant.

In some embodiments, each of the first insulating portion 524a_1 and the third insulating portion 524a_2 may include a high-k dielectric material, and the second insulating portion 524b_1 and the fourth insulating portion 524b_2 may include low-k dielectric materials having lower dielectric constants than the first insulating portion 524a_1 and the third insulating portion 524a_2, respectively.

For example, each of the first insulating portion 524a_1 and the third insulating portion 524a_2 may include a high-k dielectric material having a dielectric constant of 7 or more (e.g., 7 to 1000), for example, hafnium silicon oxynitride, hafnium, zirconium oxide, tantalum oxide, titanium oxide, strontium titanium oxide, and/or barium strontium titanium oxide. Each of the second insulating portion 524b_1 and the fourth insulating portion 524b_2 may include a low-k dielectric material having a dielectric constant of less than 7 (e.g., 1.5 to 6.9). The low-k dielectric material may include, for example, polyimide, a silicon-based material (e.g., $SiO_2$, SiOC, SiC, SiCN, SiON, or SiCOH), polybenzoxazole, and/or an epoxy-based material. In some embodiments, the first insulating portion 524a_1 and the third insulating portion 524a_2 may include the same material, and the second insulating portion 524b_1 and the fourth insulating portion 524b_2 may include the same material, but the inventive concepts are not limited thereto.

As described with reference to FIGS. 1A to 4, when each of the first redistribution insulating layer 524_1 and the second redistribution insulating layer 524_2 includes insulating portions having different dielectric constants, power integrity characteristics of the semiconductor package 400 may be improved, and desired signal integrity characteristics may also be maintained.

Meanwhile, the first and second redistribution layers 522_1 and 522_2 and the outermost insulating layer 526 may respectively have substantially the same structures and materials as the first and second redistribution layers 422_1 and 422_2 and the outermost insulating layer 426 described with reference to FIG. 4, and thus descriptions thereof are omitted.

Figure 6:
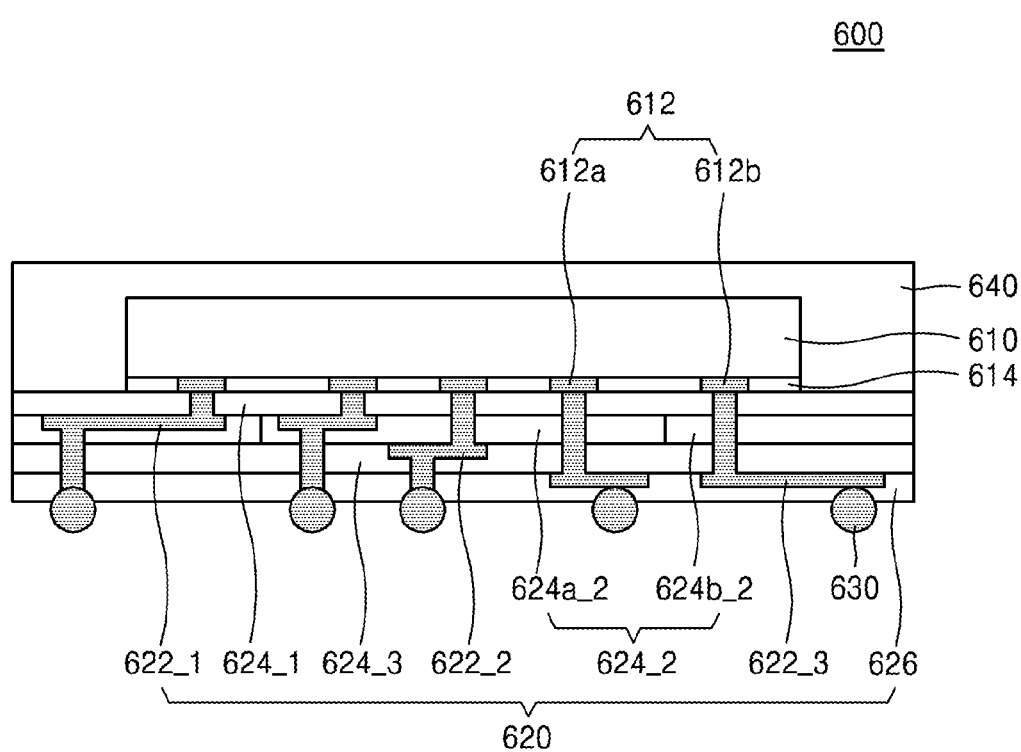
FIG. 6 is a cross-sectional view of a semiconductor package according to some example embodiments.

FIG. 6 is a cross-sectional view of a semiconductor package 600 according to some example embodiments.

The semiconductor package 600 shown in FIG. 6 may be a WLP having a similar structure to the semiconductor package 400 described with reference to FIG. 4 except that the semiconductor package 600 includes a triple redistribution insulating layer, for example, first to third redistribution insulating layers 624_1, 624_2, and 624_3.

Referring to FIG. 6, the semiconductor package 600 may include a semiconductor chip 610, a redistribution structure 620, external connection terminals 630, and a mold unit 640.

Chip pads 612 including a power/ground pad 612a and a signal pad 612b and a protection layer 614 may be formed on one surface of the semiconductor chip 610.

The semiconductor chip 610, the chip pads 612, the protection layer 614, the external connection terminals 630, and the mold unit 640 may substantially have the same structures as the semiconductor chip 410, the chip pads 412, the protection layer 414, the external connection terminals 430, and the mold unit 440 described with reference to FIG. 4, and thus descriptions thereof are omitted.

The redistribution structure 620 may include first to third redistribution layers 622_1, 622_2, and 622_3 connected to the chip pads 612, a first redistribution insulating layer 624_1 interposed between the semiconductor chip 610 and the first redistribution layer 622_1, a second redistribution insulating layer 624_2 interposed between the first redistribution layer 622_1 and the second redistribution layer 622_2, a third redistribution insulating layer 624_3 interposed between the second redistribution layer 622_2 and the third redistribution layer 622_3, and an outermost insulating layer 626 formed to cover at least portions of the third redistribution layers 622_3 and the external connection terminals 630.

The first to third redistribution layers 622_1, 622_2, and 622_3 may connect the chip pads 612 of the semiconductor chip 610 with the external connection terminals 630, respectively, so that power supplied from outside the semiconductor package 600 may be transmitted to the semiconductor chip 610 or the semiconductor chip 610 may transmit and receive signals to and from outside the semiconductor package 600.

In some embodiments, each of the first and third redistribution layers 622_1 and 622_3 may serve as a power plane configured to transmit power supplied from outside the semiconductor package 600 to the semiconductor chip 610. When each of the first and third redistribution layers 622_1 and 622_3 is a power plane as described above, the second redistribution layer 622_2 may serve as a ground plane connected to a ground disposed outside the semiconductor package 600.

The present embodiment describes an example in which the first and third redistribution layers 622_1 and 622_3 are power planes and the second redistribution layer 622_2 is a ground plane. However, in another case, the first and third redistribution layers 622_1 and 622_3 may be ground planes, and the second redistribution layer 622_2 may be a ground plane.

The first redistribution insulating layer 624_1 may be interposed between the semiconductor chip 610 and the first redistribution layer 622_1. That is, the first redistribution insulating layer 624_1 may be formed in a region between the chip pads 612 and the first redistribution layer 622_1.

The second redistribution insulating layer 624_2 may be interposed between the first redistribution layer 622_1 and the second redistribution layer 622_2, and the third redistribution insulating layer 624_3 may be interposed between the second redistribution layer 622_2 and the third redistribution layer 622_3.

In some embodiments, at least one of the first to third redistribution insulating layers 624_1, 624_2 and 624_3 may include insulating portions having different dielectric constants.

In a specific example, the second redistribution insulating layer 624_2 may include a first insulating portion 624a_2 having a first dielectric constant and a second insulating portion 624b_2 having a second dielectric constant.

In some embodiments, the first insulating portion 624a_2 may include a high-k dielectric material, and the second insulating portion 624b_2 may include a low-k dielectric material having a lower dielectric constant than the first insulating portion 624a_2. For example, the first insulating portion 624a_2 may include a high-k dielectric material having a dielectric constant of 7 or more (e.g., 7 to 1000). The first insulating portion 624a_2 may include, for example, hafnium silicon oxynitride, hafnium oxide, zirconium oxide, tantalum oxide, titanium oxide, strontium titanium oxide, and/or barium strontium titanium oxide. The second insulating portion 624b_2 may include a low-k dielectric material having a dielectric constant of less than 7 (e.g., 1.5 to 6.9). The low-k dielectric material may include, for example, polyimide, a silicon-based material (e.g., $SiO_2$, SiOC, SiC, SiCN, SiON, or SiCOH) polybenzoxazole, and/or an epoxy-based material. In some embodiments, each of the first redistribution insulating layer 624_1 and/or the third redistribution insulating layer 624_3 may include a first insulating portion and a second insulating portion.

In other embodiments, each of the first to third redistribution insulating layers 624_1, 624_2, and 624_3 may include a first insulating portion and a second insulating portion.

As described with reference to FIGS. 1A to 5, when at least one of the first to third redistribution insulating layers 624_1, 624_2, and 624_3 includes insulating portions having different dielectric constants, power integrity characteristics of the semiconductor package 600 may be improved, and desired signal integrity characteristics may also be maintained.

Figure 7:
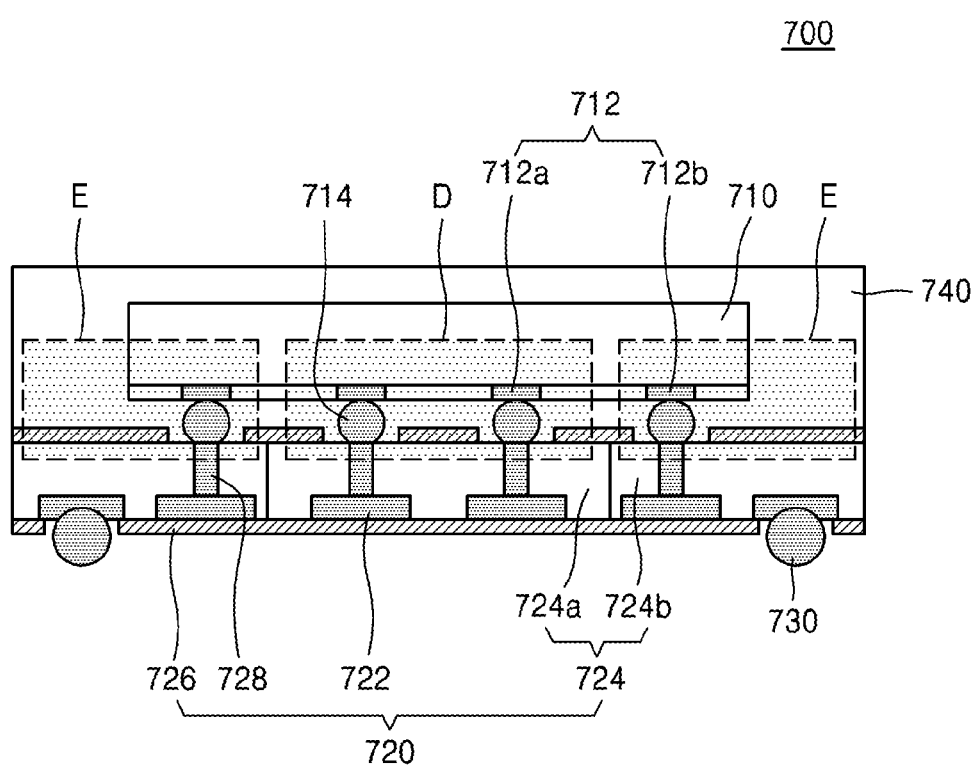
FIG. 7 is a cross-sectional view of a semiconductor package according to some example embodiments.

FIG. 7 is a cross-sectional view of a semiconductor package 700 according to some example embodiments.

Unlike the semiconductor packages 100, 200, 300, 400, 500, and 600 described with reference to FIGS. 1A to 6, the semiconductor package 700 shown in FIG. 7 may be a semiconductor package including a PCB 720.

Referring to FIG. 7, the semiconductor package 700 may include a semiconductor chip 710, a PCB 720, external connection terminals 730, and a mold unit 740.

The semiconductor chip 710 may be mounted on the PCB 720 by using a flip-chip bonding process so that an active surface of the semiconductor chip 710 on which chip pads 712 are disposed is combined with the PCB 720 through bumps 714.

The semiconductor chip 710, the external connection terminals 730, and the mold unit 740 may respectively have substantially the same structures as the semiconductor chip 210, the external connection terminals 230, and the mold unit 240 described with reference to FIGS. 2A and 2B, and thus descriptions thereof are omitted.

The PCB 720 may include interconnection patterns 722, a body resin 724, through contacts 728, and solder resist (SR) 726.

In some embodiments, as shown in FIG. 7, the interconnection patterns 722 may be formed on any one of a top surface or a bottom surface of the body resin 724. In this case, the PCB 720 may be a single-sided PCB.

In some other embodiments, unlike shown in FIG. 7, the interconnection patterns 722 may be formed on two surfaces of the body resin 724. In this case, the PCB 720 may be a double-sided PCB.

As shown in FIG. 7, the interconnection patterns 722 may be of a buried type and formed in the body resin 724. However, the inventive concepts are not limited thereto, and the interconnection patterns 722 may be of a normal type and formed on an outer surface of the body resin 724. The formation of the interconnection patterns 722 may include forming interconnection patterns having a desired (or, alternatively a predetermined) shape on a metal thin layer by using a plating process and bonding a prepreg resin under pressure to the interconnection patterns. However, the inventive concepts are not limited thereto, and the formation of the interconnection patterns 722 may include plating or depositing a metal thin layer on the entire surface of the body resin 724 and etching the metal thin layer by using a photoresist (PR) pattern.

The body resin 724 may include a prepreg resin, which is a semi-cured resin obtained by permeating a thermosetting resin into glass fiber. However, the body resin 724 is not limited to the prepreg resin and may include various other resins. For example, the body resin 724 may include a thermosetting epoxy resin, a thermoplastic epoxy resin, or a filler-containing resin.

The body resin 724 may include a first insulating portion 724a and a second insulating portion 724b.

In some embodiments, the first insulating portion 724a may be formed to overlap a region (a region D) in which a power/ground pad 712a of the semiconductor chip 710 is formed. That is, the first insulating portion 724a may overlap a central region of the semiconductor chip 710. The second insulating portion 724b may be formed to overlap an edge region (a region E) that surrounds the D region. The second insulating portion 724b may overlap a region in which a signal pad 712b is formed.

In the present embodiment, the power/ground pad 712a may be disposed in the central region (the inside of the region D) of the semiconductor chip 710, and the signal pad 712b may be disposed in the edge region (outside the region E) thereof. However, the inventive concepts are not limited thereto, and the power/ground pad 712a and the signal pad 712b may have various arrangement structures. In this case, an arrangement structure of the first insulating portion 724a and the second insulating portion 724b may also vary depending on the arrangement structure of the power/ground pad 712a and the signal pad 712b.

In some embodiments, the first insulating portion 724a may include a high-k dielectric material, and the second insulating portion 724b may include a low-k dielectric material having a lower dielectric constant than the first insulating portion 724a.

For instance, the first insulating portion 724a may include a material having a dielectric constant of 7 or more (e.g., 7 to 1000), for example, hafnium silicon oxynitride, hafnium, zirconium oxide, tantalum oxide, titanium oxide, strontium titanium oxide, and/or barium strontium titanium oxide. The second insulating portion 724b may include a material having a dielectric constant of less than 7 (e.g., 1.5 to 6.9). The second portion 724b may include, for example, polyimide, a silicon-based material (e.g., $SiO_2$, SiOC, SiC, SiCN, SiON, or SiCOH), polybenzoxazole, and/or an epoxy-based material.

As described with reference to FIGS. 1A and 1B, when the body resin 724 includes a first insulating portion 724a and a second insulating portion 724b having different dielectric constants, power integrity characteristics of the semiconductor package 700 may be improved, and desired signal integrity characteristics may also be maintained.

The solder resist 726 may be formed on top and bottom surfaces of the body resin 724 and protect the PCB 720 from the outside.

The through contacts 728 may be formed in only selected desired (or, alternatively a predetermined) pattern regions of the interconnection patterns 722 and penetrate the body resin 724.

The formation of the through contacts 728 may include forming the interconnection patterns 722 on a metal thin layer, forming the through contacts 728 by plating selected portions of the interconnection patterns 722, and bonding the resultant structure having the interconnection patterns 722 and the through contacts 728 under pressure to the prepreg resin serving as the body resin 724. However, a method of forming the through contacts 728 is not limited thereto. For example, the formation of the through contacts 728 may include forming via holes for through contacts by using a desired (or, alternatively a predetermined) PR pattern mask in a reverse surface of a surface of the body resin 724 on which the interconnection patterns 722 are formed, and filling the via holes with a metal material.

FIGS. 8A to 8H are cross-sectional views of process operations of a method of manufacturing a semiconductor package according to some example embodiments.

FIGS. 8A to 8H illustrate an example of a method of manufacturing a semiconductor package, and the order of formation of respective layers and methods of forming the respective layers are not limited to the present embodiment. Furthermore, various other layers, which are not disclosed in the present embodiment, may be further formed between the respective layers.

In FIGS. 8A to 8H, the same reference numerals are used to denote the same elements as in FIGS. 1A to 7, and repeated descriptions thereof are omitted for brevity.

Figure 8A:
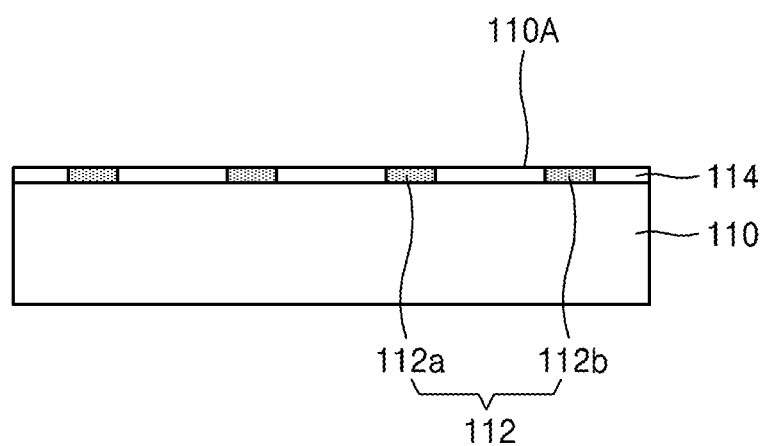
FIGS. 8A to 8H are cross-sectional views of a method of manufacturing a semiconductor package according to some example embodiments.

Referring to FIG. 8A, a semiconductor chip 110 having one surface 110A on which chip pads 112 and a protection layer 114 are provided may be prepared.

The chip pads 112 may include, for example, aluminum (Al) or copper (Cu). In some embodiments, the chip pads 112 may be formed by using a plating process (e.g., a pulse plating process or a DC electroplating process) or a deposition process.

The protection layer 114 may serve to protect the semiconductor chip 110, and insulate separate chip pads 112 from one another. In some embodiments, the protection layer 114 may serve as an etch stop layer during a patterning process to be described later with reference to FIG. 8C. The protection layer 114 may be, for example, a silicon oxide layer or a silicon oxynitride layer.

Figure 8B:
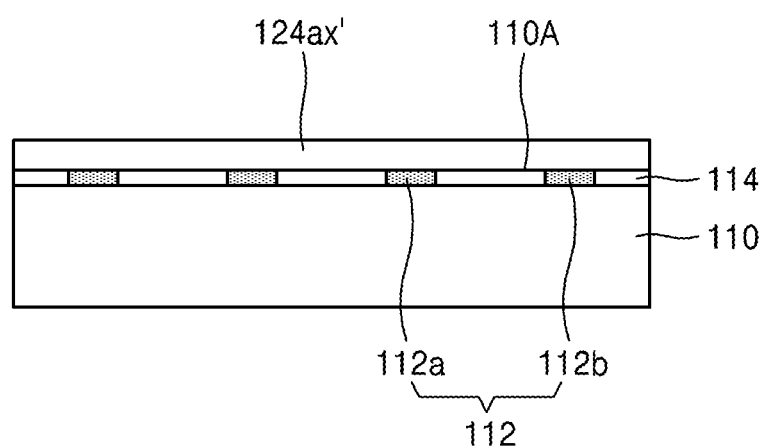

Referring to FIG. 8B, a first insulating layer 124ax' may be formed on one surface 110A of the semiconductor chip 110.

The first insulating layer 124ax' may be a layer for forming the first insulating portion 124a described with reference to FIGS. 1A and 1B. Thus, the first insulating layer 124ax' may include a high-k dielectric material having a dielectric constant of 7 or more (e.g., 7 to 1000). The first insulating layer 124ax' may include, for example, hafnium silicon oxynitride, hafnium, zirconium oxide, tantalum oxide, titanium oxide, strontium titanium oxide, an/or barium strontium titanium oxide.

In some embodiments, the first insulating layer 124ax' may be formed by using a chemical vapor deposition (CVD) process or a physical vapor deposition (PVD) process.

Specifically, the formation of the first insulating layer 124ax' by using the CVD process may be performed by a thermal CVD process for generating vapors of a compound due to thermal energy, a plasma CVD process for decomposing a reactive gas due to plasma, or an optical CVD process for decomposing source gas molecules due to light energy of a light source, such as laser beams. The PVD process for growing the first insulating layer 124ax' by accumulating generated vapors may be performed using a vacuum evaporation process, a sputtering process, or an ion plating process, but the inventive concepts are not limited thereto.

Figure 8C:
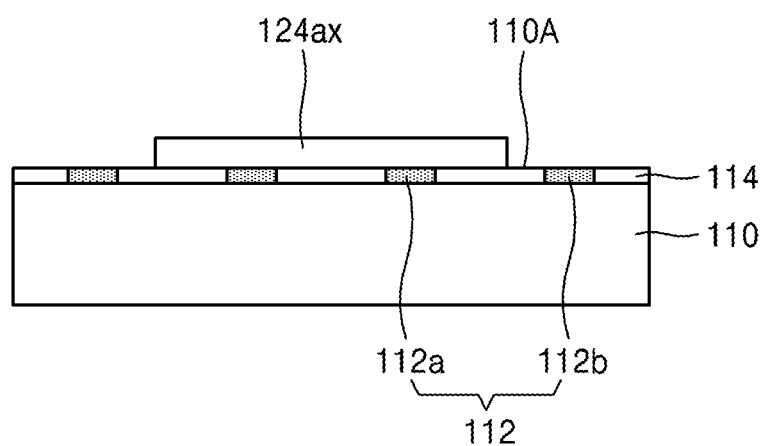

Referring to FIG. 8C, the first insulating layer 124ax' of FIG. 8B may be patterned to form a first insulating portion 124ax.

As described above with reference to FIG. 1A, the first insulating portion 124ax may be formed to overlap a region (inside the region A of FIG. 1A) in which a power/ground pad 112a of the semiconductor chip 110 is formed.

In some embodiments, the patterning process for forming the first insulating portion 124ax may include forming a mask pattern on the first insulating layer 124ax' of FIG. 8B and performing an etching process by using the mask pattern as an etch mask. In the etching process, the protection layer 114 may serve as an etch stop layer, but the inventive concepts are not limited thereto, and an additional etch stop layer may be formed on the chip pads 112 and the protection layer 114.

Figure 8D:
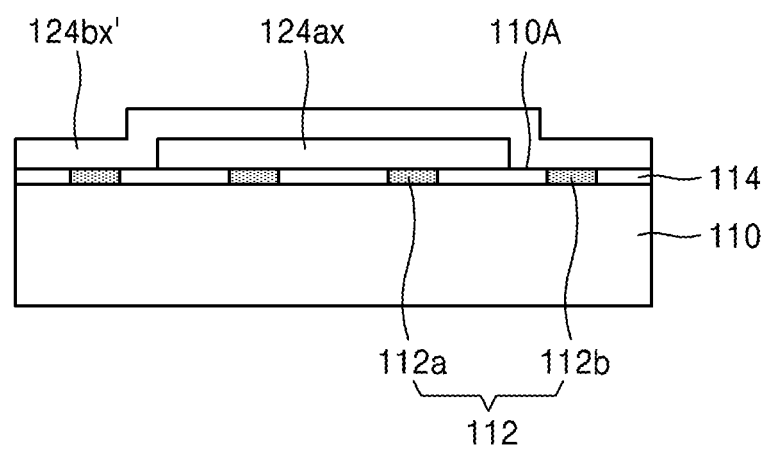

Referring to FIG. 8D, a second insulating layer 124bx' may be formed on the one surface 110A of the semiconductor chip 110 to cover the first insulating portion 124ax.

The second insulating layer 124bx' may be a layer for forming the second insulating portion 124b described with reference to FIGS. 1A and 1B. Thus, the second insulating layer 124bx' may include a material having a lower dielectric constant than the first insulating portion 124ax, for example, a material having a dielectric constant of less than 7 (e.g., 1.5 to 6.9). The second insulating layer 124bx' may include, for example, polyimide, a silicon-based material (e.g., $SiO_2$, SiOC, SiC, SiCN, SiON, or SiCOH), polybenzoxazole, or an epoxy-based material. In some embodiments, the formation of the second insulating layer 124bx' may be performed by using a CVD process or a PVD process.

Figure 8E:
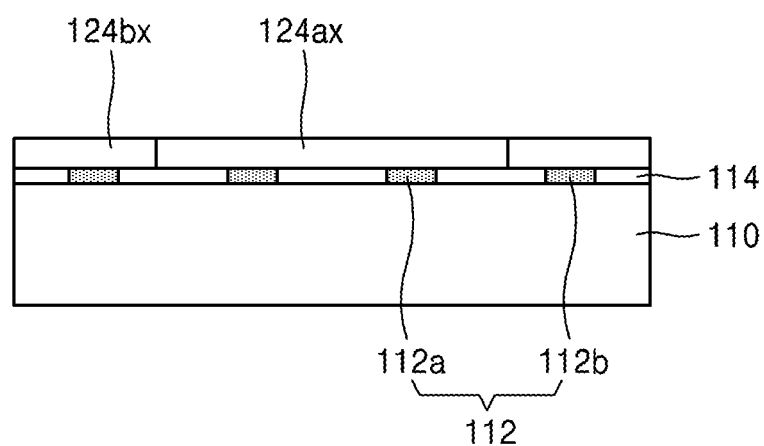

Referring to FIG. 8E, a planarization process may be performed on the second insulating layer 124bx' to form a second insulating portion 124bx. The planarization process may be, for example, a chemical mechanical polishing (CMP) process. The first and second insulating portions 124ax and 124bx may have coplanar surfaces.

Although the present embodiment describes a case in which the second insulating portion 124bx is formed after the first insulating portion 124ax is formed, the first insulating portion 124ax and the second insulating portion 124bx may be formed in any other order. That is, unlike in the present embodiment, after the second insulating portion 124bx is formed to overlap a region (outside the region A of FIG. 1A) in which the signal pad 112b of the semiconductor chip 110 is formed, the first insulating portion 124ax may be formed.

Figure 8F:
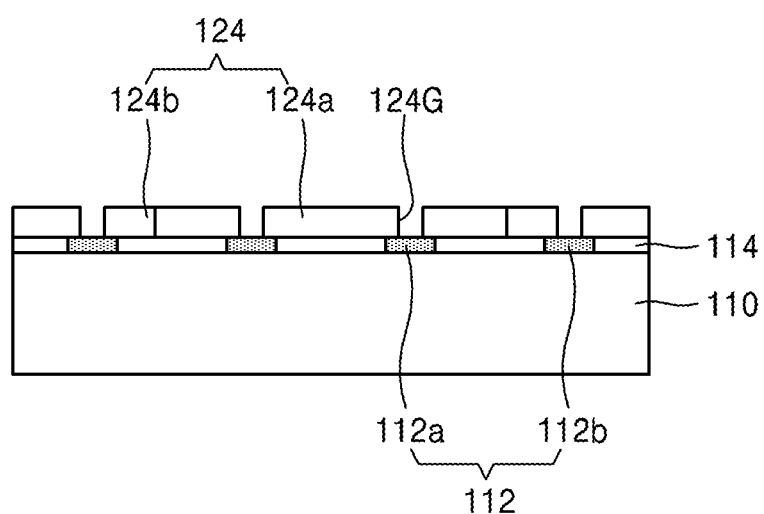

Referring to FIG. 8F, openings 124G exposing the chip pads 112 may be formed in the first insulating portion 124ax and second insulating portion 124bx. Thus, a redistribution insulating layer 124 including the first insulating portion 124a and the second insulating portion 124b may be formed.

Figure 8G:
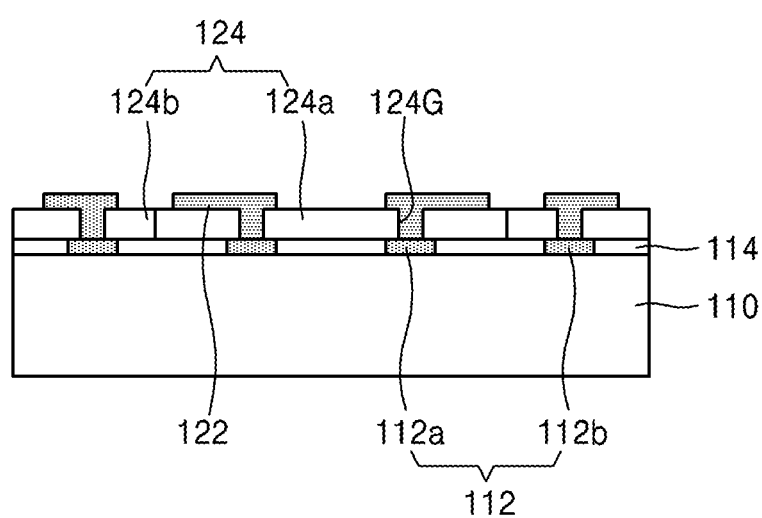

Referring to FIG. 8G, a redistribution layer 122 may be formed on the redistribution insulating layer 124.

For example, the formation of the redistribution layer 122 may include forming a metal layer to cover redistribution insulating layer 124 and the chip pads 112 exposed by the openings 124G of the redistribution insulating layer 124 and patterning the metal layer.

The metal layer may be formed by using, for example, a CVD process, an atomic layer deposition (ALD) process, or a sputtering process, but the inventive concepts are not limited thereto.

In some embodiments, the metal layer may be formed by using an electroless plating process, or a deposition process. The redistribution layer 122 may include, for example, at least one of copper (Cu), nickel (Ni), palladium (Pd), sliver (Ag), chromium (Cr), titanium (Ti), and gold (Au). Also, the redistribution layer 122 may be a multi-level layer formed of the above-described materials. However, conductive materials forming the redistribution layer 122 are not limited to the above-described examples.

Figure 8H:
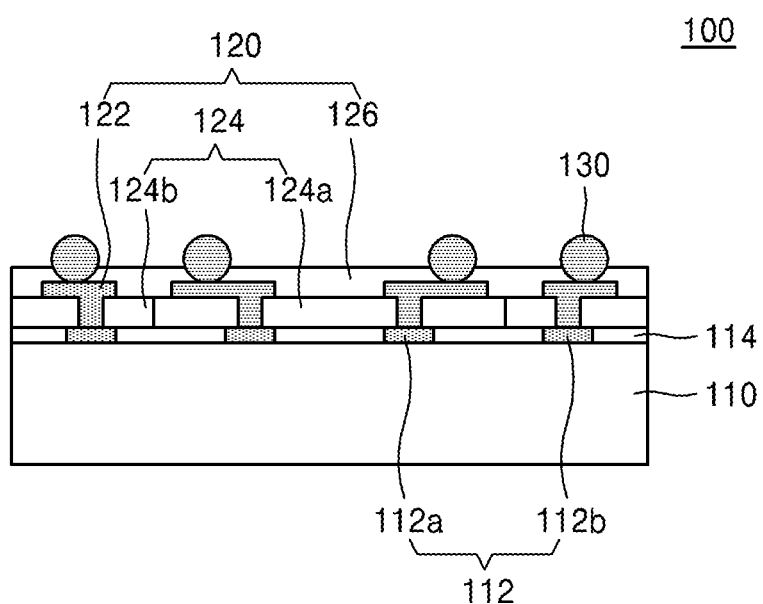

Referring to FIG. 8H, an outermost insulating layer 126 and external connection terminals 130 may be formed, thereby completing manufacture of the semiconductor package 100. Although not shown, an under bump metallurgy (UBM) layer may be further interposed between the outermost insulating layer 126 and the external connection terminals 130.

The external connection terminals 130 may be formed by using a reflow process, but the inventive concepts are not limited thereto.

Figure 9:
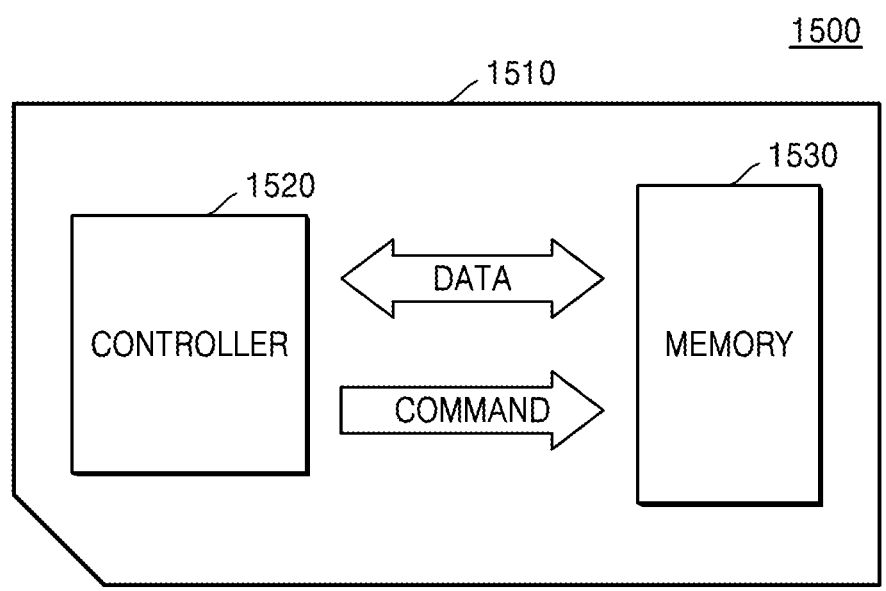
FIG. 9 is a schematic block diagram of a memory system including a semiconductor memory device according to some example embodiments.

FIG. 9 is a schematic block diagram of a memory system 1500 including a semiconductor memory device according to some example embodiments.

Referring to FIG. 9, the memory system 1500 may be a semiconductor storage device, for example, a memory card or a solid-state drive (SSD). The memory system 1500 may include a controller 1520 and a memory 1530, which may be disposed in a housing 1510. The controller 1520 and the memory 1530 may exchange electric signals. For example, the memory 1530 and the controller 1520 may exchange data in response to a command of the controller 1520. Thus, the memory system 1500 may store data in the memory 1530 or externally output data from the memory 1530. The memory 1530 and/or the controller 1520 may include a semiconductor package according to the some example embodiments.

Figure 10:
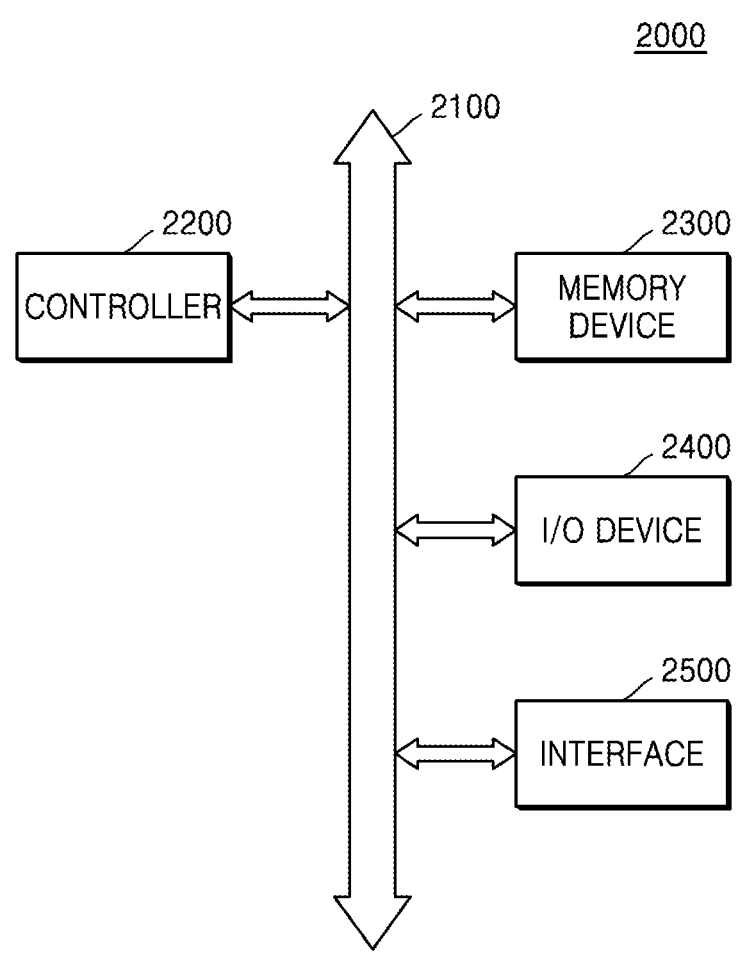
FIG. 10 is a block diagram of an example of an electronic system including a semiconductor memory device according to some example embodiments.

FIG. 10 is a block diagram of an example of an electronic system including a semiconductor memory device according to some example embodiments.

Referring to FIG. 10, the electronic system 2000 may include a controller 2200, a memory device 2300, and an input/output (I/O) device 2400). The controller 2200, the memory device 2300, and the I/O device 2400 may be combined with one another via a bus 2100. The bus 2100 may be a path through which data is transmitted. For example, the controller 2200 may include at least one of a microprocessor, a digital signal processor, a microcontroller, and logic devices capable of performing similar functions thereto. The I/O device 2400 may include at least one of a keypad, a keyboard, and a display device. The memory device 2300 may be a data storage device. The memory device 2300 may store data and/or commands executed by the controller 2200. The memory device 2300 may include a volatile memory device and/or a non-volatile memory device. The memory device 2300 may include a flash memory. The flash memory may include an SSD. In this case, the electronic system 2000 may stably store a large amount of data in the memory device 2300. Each of the controller 2200 and the memory device 2300 may include a semiconductor package according to some example embodiments. The electronic system 2000 may further include an interface unit 2500 configured to transmit data to a communication network or receive data from the communication network. The interface unit 2500 may be of a wired type or a wireless type. For example, the interface unit 2500 may include an antenna or a wired/wireless transceiver.

While the inventive concepts have been particularly shown and described with reference to example embodiments thereof, it will be understood that various changes in form and details may be made therein without departing from the spirit and scope of the following claims.

What is claimed is:

1. A semiconductor package comprising:
a semiconductor chip having one surface on which chip pads are formed; and
a redistribution structure formed on the one surface of the semiconductor chip,
wherein the redistribution structure comprises a redistribution layer connected to the chip pads and a redistribution insulating layer interposed between the semiconductor chip and the redistribution layer,
the redistribution insulating layer comprises a first insulating portion having a first dielectric constant and a second insulating portion having a second dielectric constant that is different from the first dielectric constant, and
the first insulating portion and the second insulating portion are connected to each other in a horizontal direction.

2. The semiconductor package 1, wherein the chip pads comprise a power pad, a ground pad, and a signal pad,
wherein a first region of the semiconductor chip, in which the power pad and the ground pad are disposed, overlaps the first insulating portion, and
wherein a second region of the second chip, in which the signal pad is disposed, overlaps the second insulating portion.

3. The semiconductor package of claim 1, wherein the power pad is configured to be connected to a power source disposed outside the semiconductor package, and the ground pad is configured to be connected to a ground disposed outside the semiconductor package, and
the signal pad is configured to receive and transmit signals from and to the outside of the semiconductor package.

4. The semiconductor package of claim 2, wherein the first dielectric constant is higher than the second dielectric constant.

5. The semiconductor package of claim 1, wherein the second dielectric constant ranges from 1.5 to 6.9, and
the first dielectric constant ranges from 7 to 1000.

6. The semiconductor package of claim 1, wherein the first insulating portion and the second insulating portion have coplanar surfaces on which the redistribution layer is disposed.

7. The semiconductor package of claim 1, wherein the first insulating portion is disposed in a region that overlaps a central region of the semiconductor chip in a plan view.

8. The semiconductor package of claim 7, wherein the second insulating portion is disposed in a region that surrounds the first insulating portion in the plan view.

9. The semiconductor package of claim 1, further comprising:
external connection terminals connected to the redistribution layer; and
an outermost insulating layer formed to cover at least portions of the redistribution layer and the external connection terminals, the outermost insulating layer having a third dielectric constant.

10. The semiconductor package of claim 9, wherein the third dielectric constant is lower than the first dielectric constant.

11. A semiconductor package comprising:
a semiconductor chip comprising a first region in which a power pad and a ground pad are disposed and a second region in which a signal pad is disposed; and
a redistribution structure disposed on the first and second regions of the semiconductor chip,
wherein the redistribution structure comprises:
at least one redistribution layer connected to the chip pads; and
at least one redistribution insulating layer disposed between the at least one redistribution layer and the semiconductor chip,
wherein the at least one redistribution insulating layer comprises a first insulating portion having a first dielectric constant and a second insulating portion having a second dielectric constant that is lower than the first dielectric constant, and
the first insulating portion overlaps the first region of the semiconductor chip, and the second insulating portion overlaps the second region of the semiconductor chip.

12. The semiconductor package of claim 11, wherein the at least one redistribution layer comprises a plurality of redistribution layers spaced apart from one another in a vertical direction,
wherein the power pad is connected to a first redistribution layer selected out of the redistribution layers, and the ground pad is connected to a second redistribution layer that is different from the first redistribution layer selected out of the redistribution layers.

13. The semiconductor package of claim 11, wherein the at least one redistribution insulating layer comprises first and second redistribution insulating layers,
wherein the first redistribution insulating layer comprises the first insulating portion having the first dielectric constant and the second insulating portion having the second dielectric constant, and
the second redistribution insulating layer comprises a third insulating portion that overlaps the first insulating portion and has a third dielectric constant, and a fourth insulating portion that overlaps the second insulating portion and has a fourth dielectric constant that is lower than the third dielectric constant.

14. The semiconductor package 11, wherein the at least one redistribution insulating layer comprises first and second redistribution insulating layers,
wherein the first redistribution insulating layer comprises the first insulating portion having the first dielectric constant and the second insulating portion having the second dielectric constant, and
the second redistribution insulating layer has a third dielectric constant that is lower than the first dielectric constant.

15. The semiconductor package 11, further comprising a mold unit disposed on the redistribution structure to cover the semiconductor chip.

16. A semiconductor package comprising:
a printed circuit board (PCB); and
a semiconductor chip mounted on the PCB,
wherein the PCB comprises:
a body resin having a top surface and a bottom surface; and
an interconnection pattern formed on at least one of the top surface and the bottom surface of the body resin, wherein the body resin comprises a first body portion having a first dielectric constant and a second body portion having a second dielectric constant that is different from the first dielectric constant.

17. The semiconductor package of claim 16, wherein the first dielectric constant of the first body portion is higher than the second dielectric constant of the second body portion.

18. The semiconductor package of claim 16, wherein the first dielectric constant ranges from 7 to 1000.

19. The semiconductor package of claim 16, wherein the semiconductor chip comprises a power pad, a ground pad, and a signal pad,
wherein the first body portion is disposed in a region that overlaps the power pad and the ground pad, and
the second body portion is disposed in a region that overlaps the signal pad.

20. The semiconductor package of claim 16, wherein the first body portion is disposed in a region that overlaps a central region of the semiconductor chip in a plan view, and
the second body portion is disposed in a region that surrounds the first body portion in the plan view.

* * * * *